(12) United States Patent
Balakrishnan et al.

(10) Patent No.: US 9,997,619 B1
(45) Date of Patent: Jun. 12, 2018

(54) BIPOLAR JUNCTION TRANSISTORS AND METHODS FORMING SAME

(71) Applicant: International Business Machines Corporation, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/603,611

(22) Filed: May 24, 2017

(51) Int. Cl.
*H01L 29/16* (2006.01)
*H01L 29/732* (2006.01)
*H01L 29/417* (2006.01)
*H01L 29/423* (2006.01)
*H01L 29/66* (2006.01)

(52) U.S. Cl.
CPC ...... *H01L 29/7322* (2013.01); *H01L 29/1608* (2013.01); *H01L 29/41708* (2013.01); *H01L 29/42304* (2013.01); *H01L 29/6625* (2013.01)

(58) Field of Classification Search
CPC .......................... H01L 29/7322; H01L 29/785
See application file for complete search history.

(56) References Cited

U.S. PATENT DOCUMENTS

| | | |
|---|---|---|
| 4,431,460 A | 2/1984 | Barson et al. |
| 5,444,003 A | 8/1995 | Wang et al. |
| 6,720,630 B2 | 4/2004 | Mandelman et al. |
| 6,927,140 B2 | 8/2005 | Soman et al. |
| 7,750,371 B2 | 7/2010 | Gluschenkov et al. |
| 7,900,167 B2 | 3/2011 | Gluschenkov et al. |
| 8,455,322 B2 | 6/2013 | Gluschenkov et al. |
| 9,450,069 B2 | 9/2016 | Gluschenkov et al. |
| 2016/0351682 A1 | 12/2016 | Gluschenkov et al. |
| 2016/0380086 A1 | 12/2016 | Suriono |

OTHER PUBLICATIONS

J. Cai, et al., "SOI lateral bipolar transistor with drive current >3mA/μm", SOI-3D-Subthreshold Microelectronics Technology Unified Conference (S3S), 2013 IEEE.
Tak H. Ning, "A Perspective on SOI Symmetric Lateral Bipolar Transistors for Ultra-Low-Power Systems", Journal of the Electron Devices Society, vol. 4, No. 5, Sep. 2016.
J.-B. Yau, et al., "SiGe-on-Insulator Symmetric Lateral Bipolar Transistors", SOI-3D-Subthreshold Microelectronics Technology Unified Conference (S3S), 2015 IEEE.

*Primary Examiner* — Fernando L Toledo
*Assistant Examiner* — Valerie N Newton
(74) *Attorney, Agent, or Firm* — Harrington & Smith; Louis J. Percello

(57) ABSTRACT

A BJT includes a pillar formed on a buried oxide layer that is itself formed on a silicon substrate. The pillar has top and bottom surfaces and sidewalls, the bottom surface contacting the buried oxide layer and opposite the top surface. The pillar forms part of a base of the BJT. Si:C layers are formed on a bottom portion of each of the sidewalls of the pillar and leave a top portion of the sidewalls of the pillar exposed. A doped base contact is formed to contact at least part of the exposed sidewalls in the top portion of the pillar. E/C regions are formed abutting the Si:C layers. Contacts are formed to connect to the doped base contact and to the E/C regions. Methods for forming the BJT are also disclosed.

23 Claims, 19 Drawing Sheets

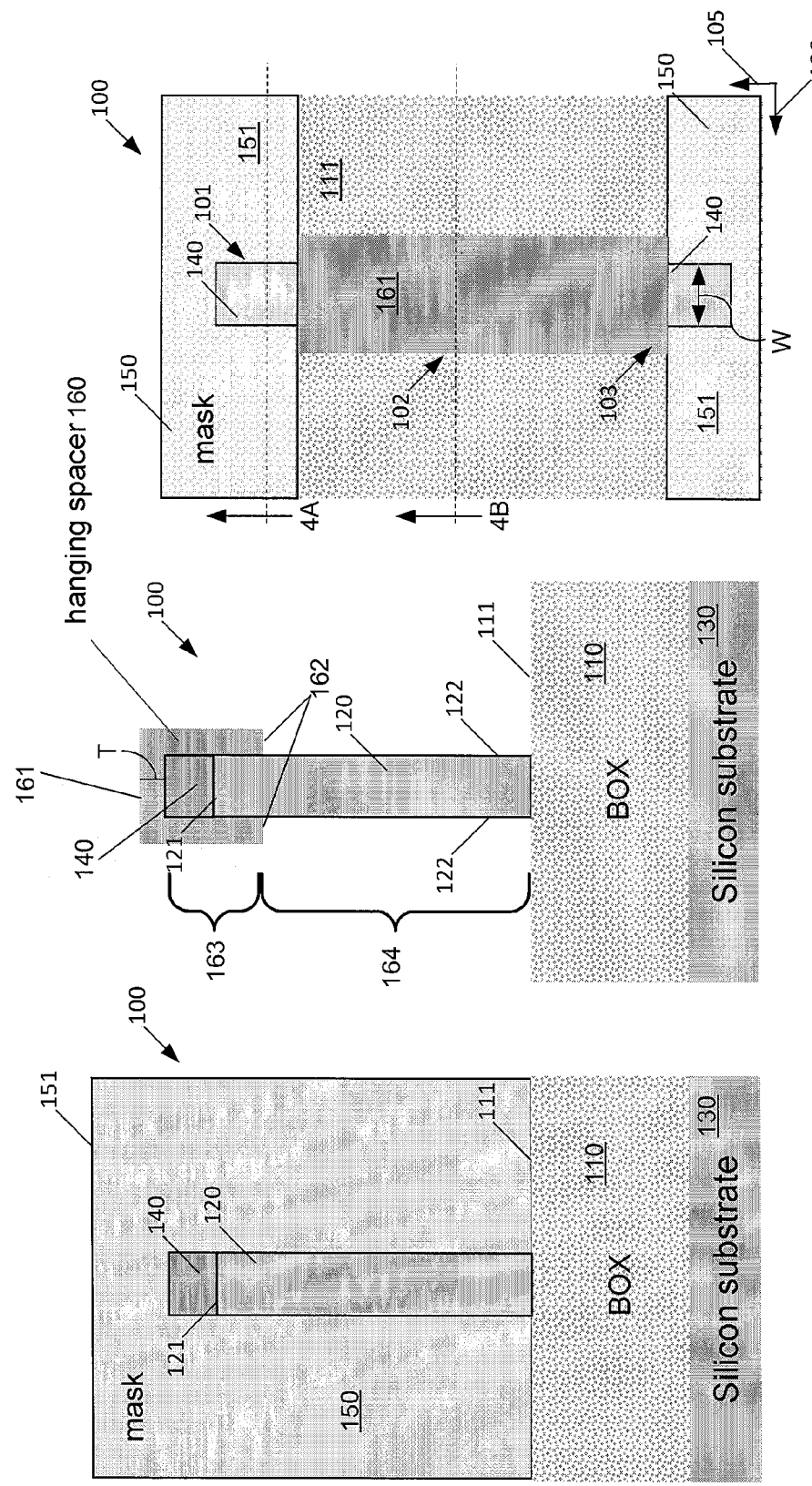

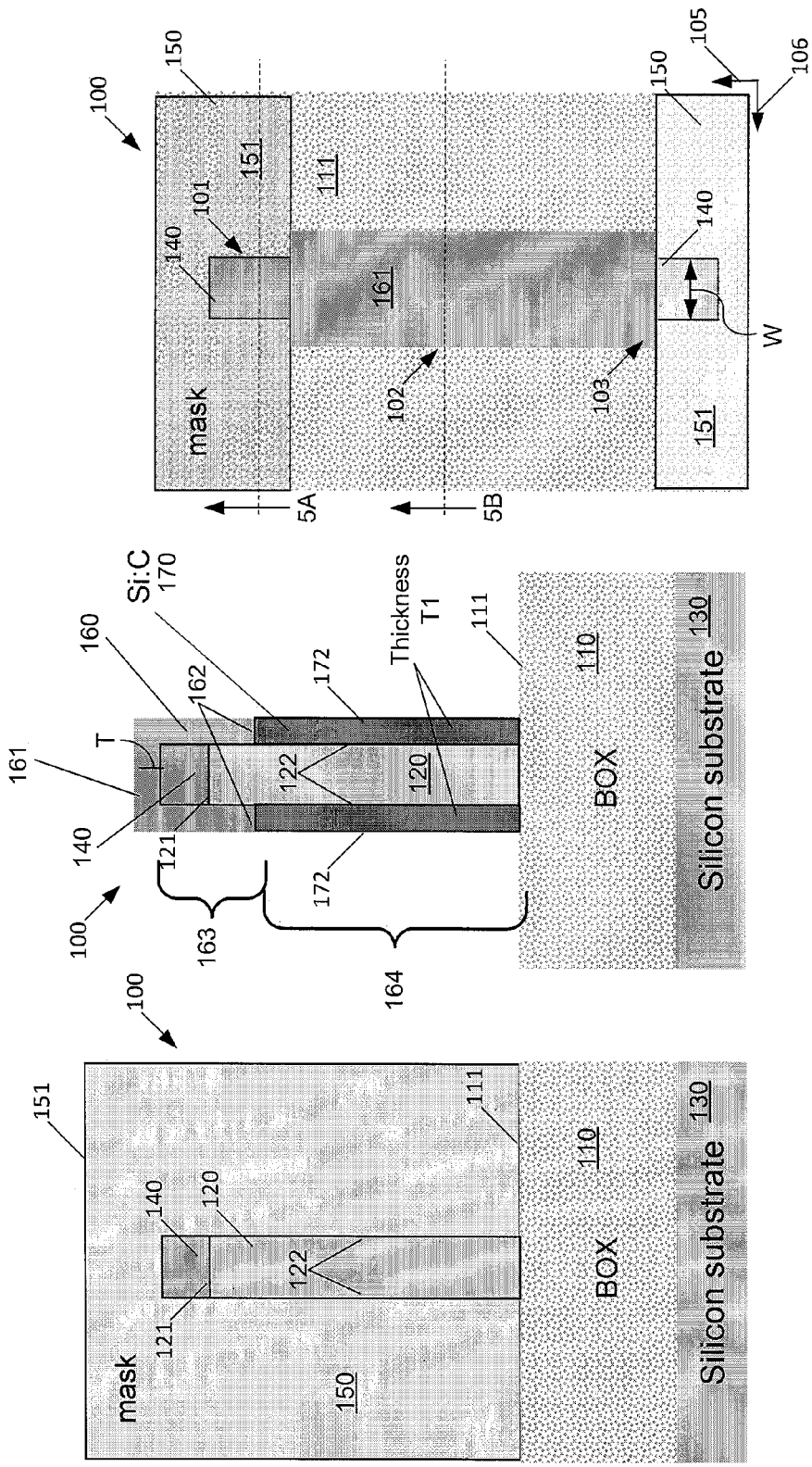

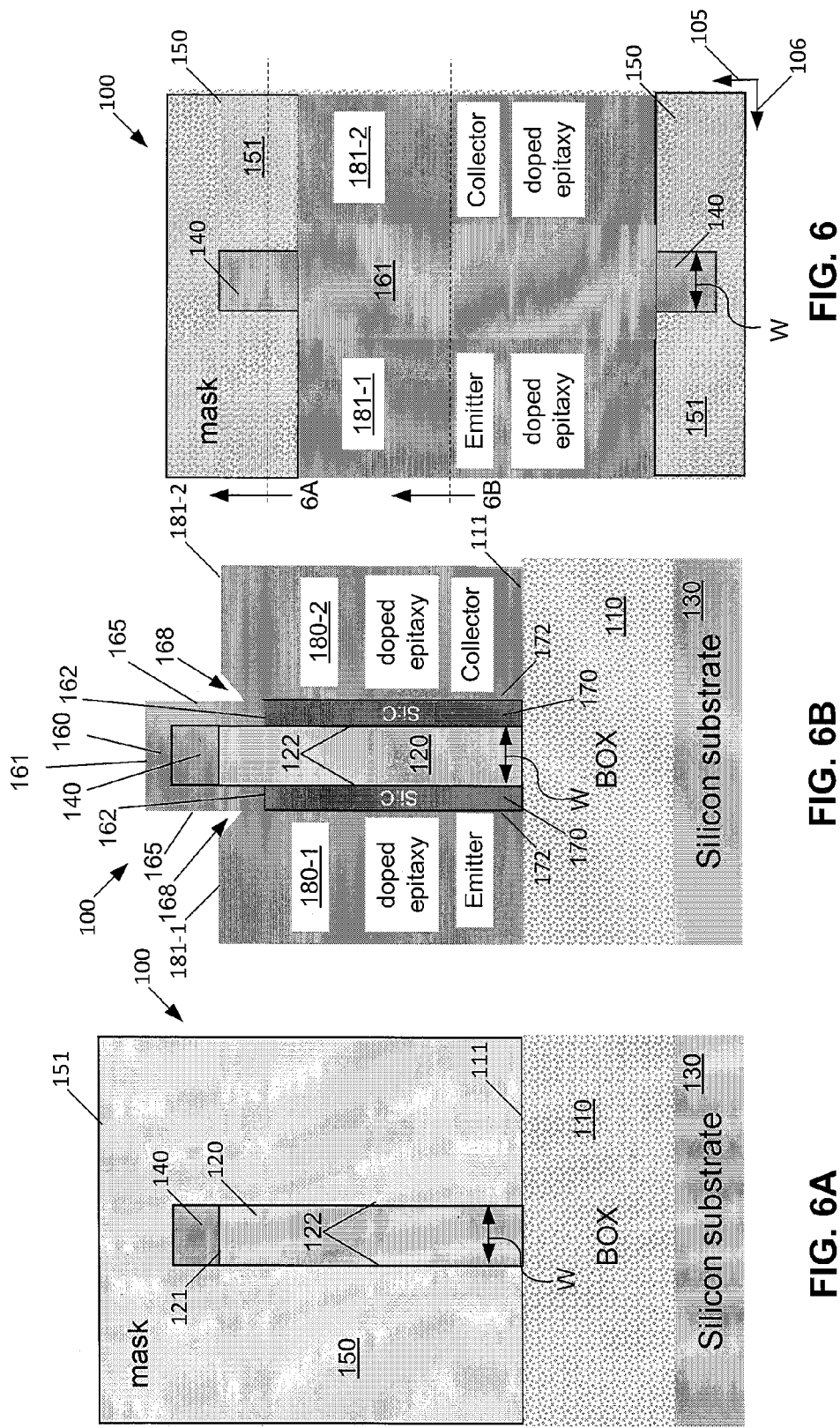

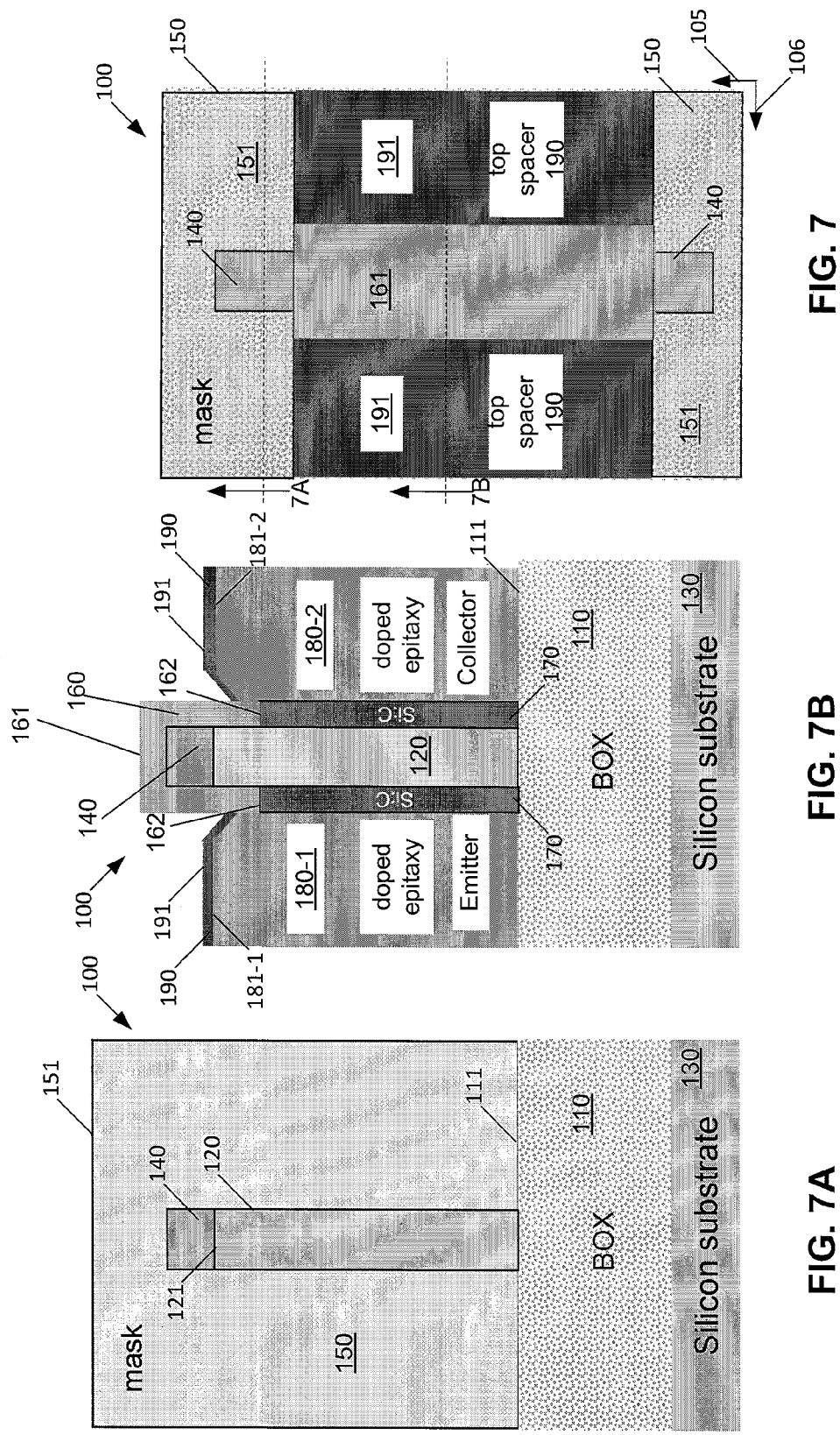

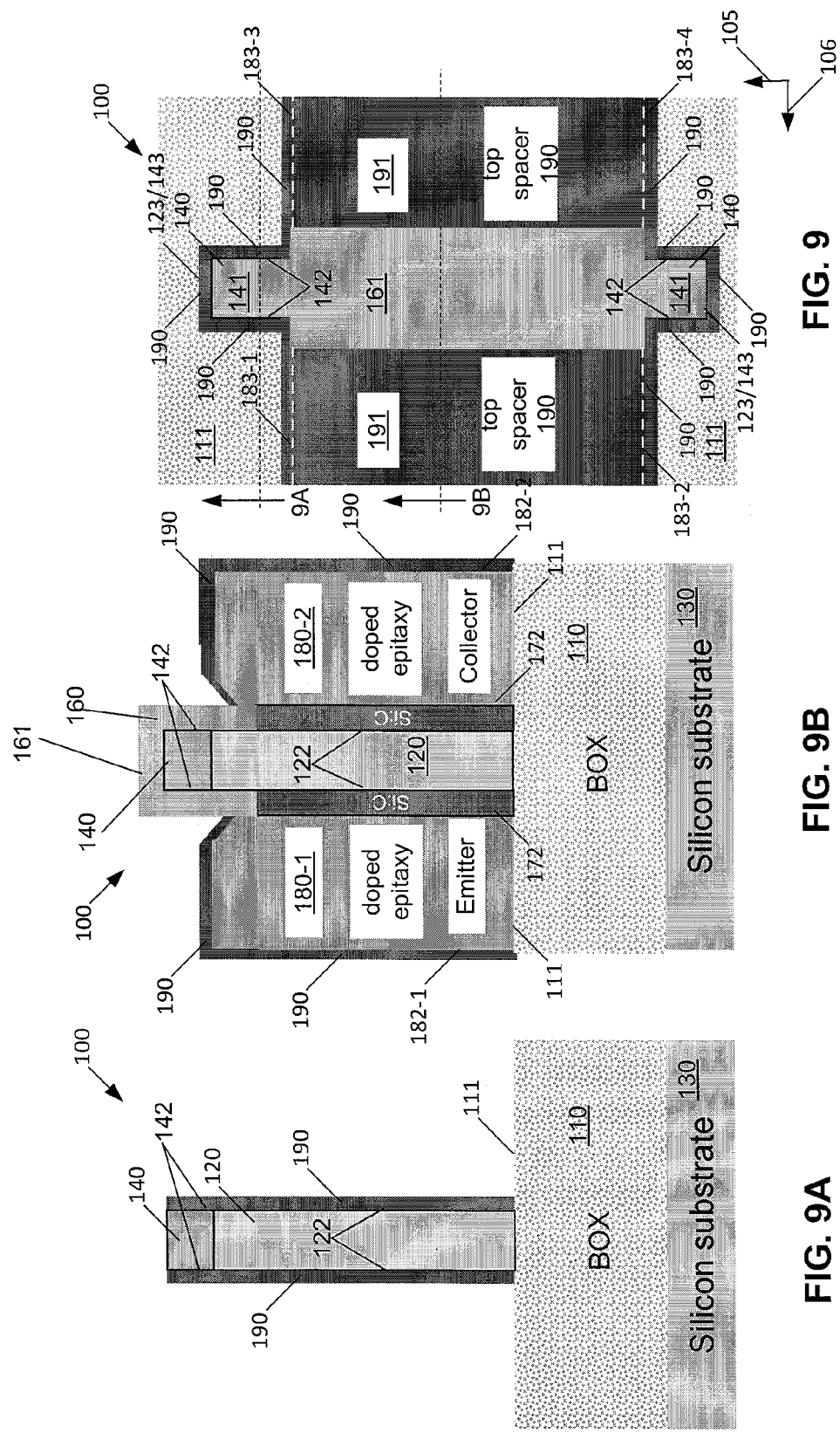

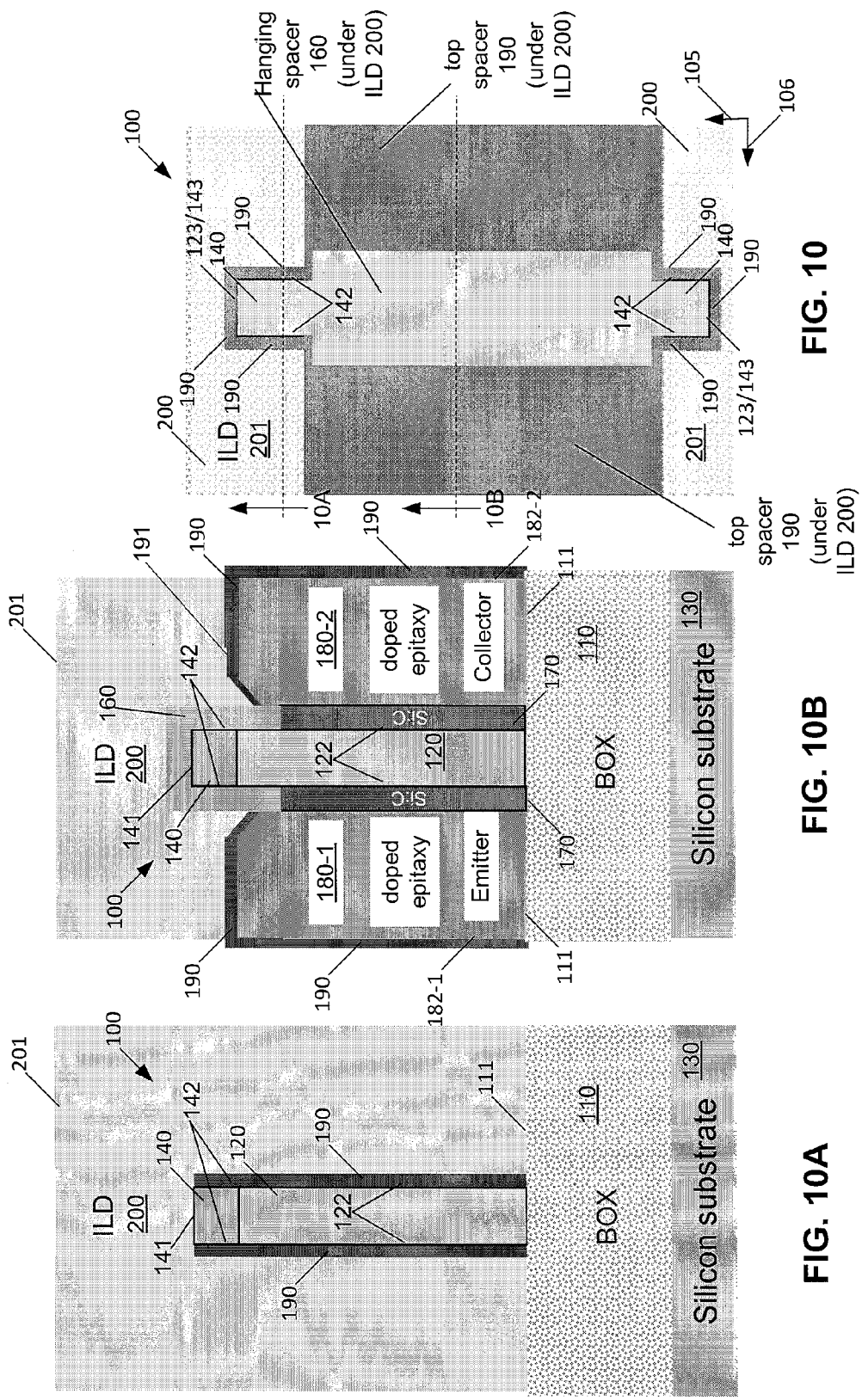

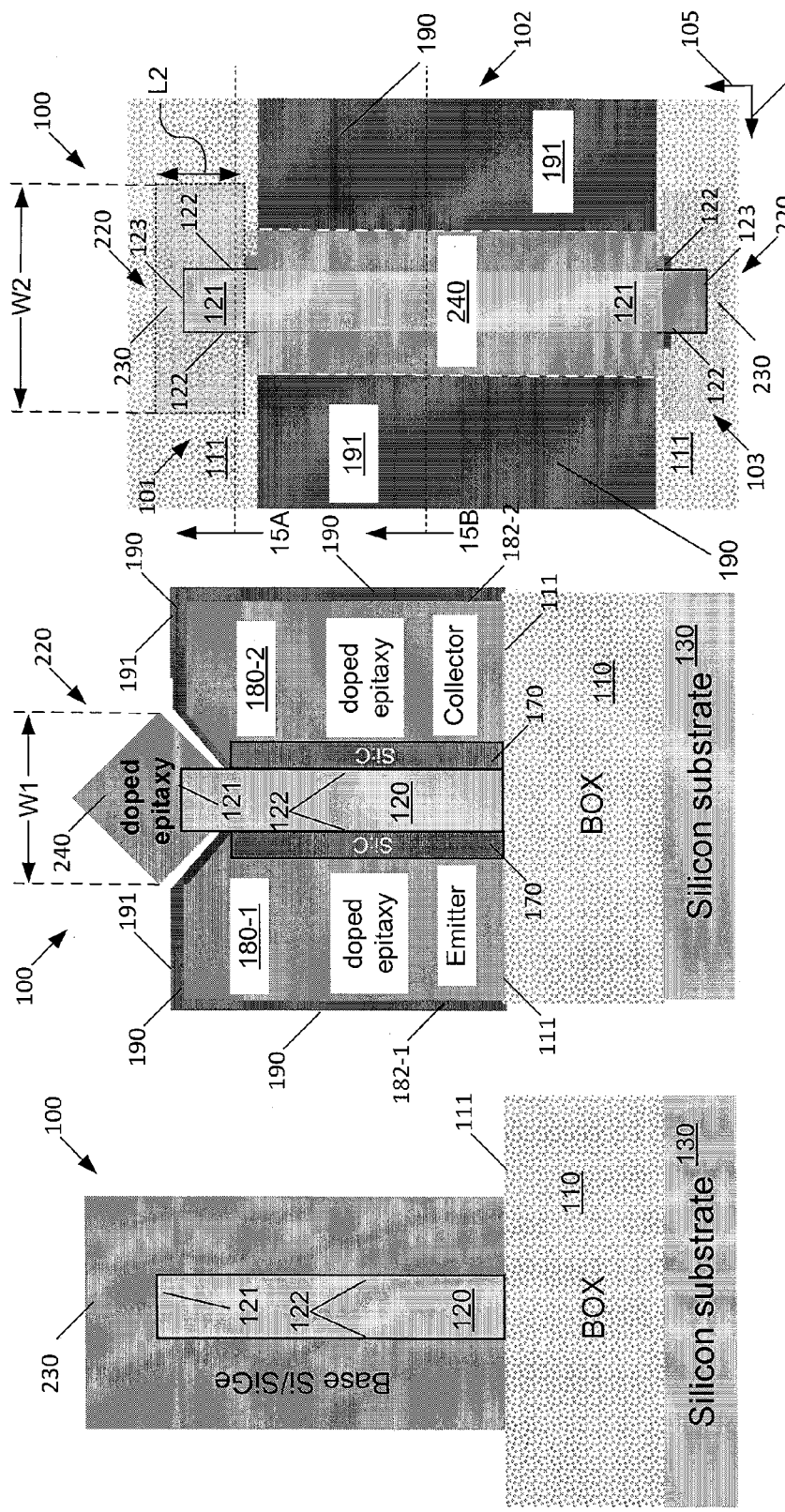

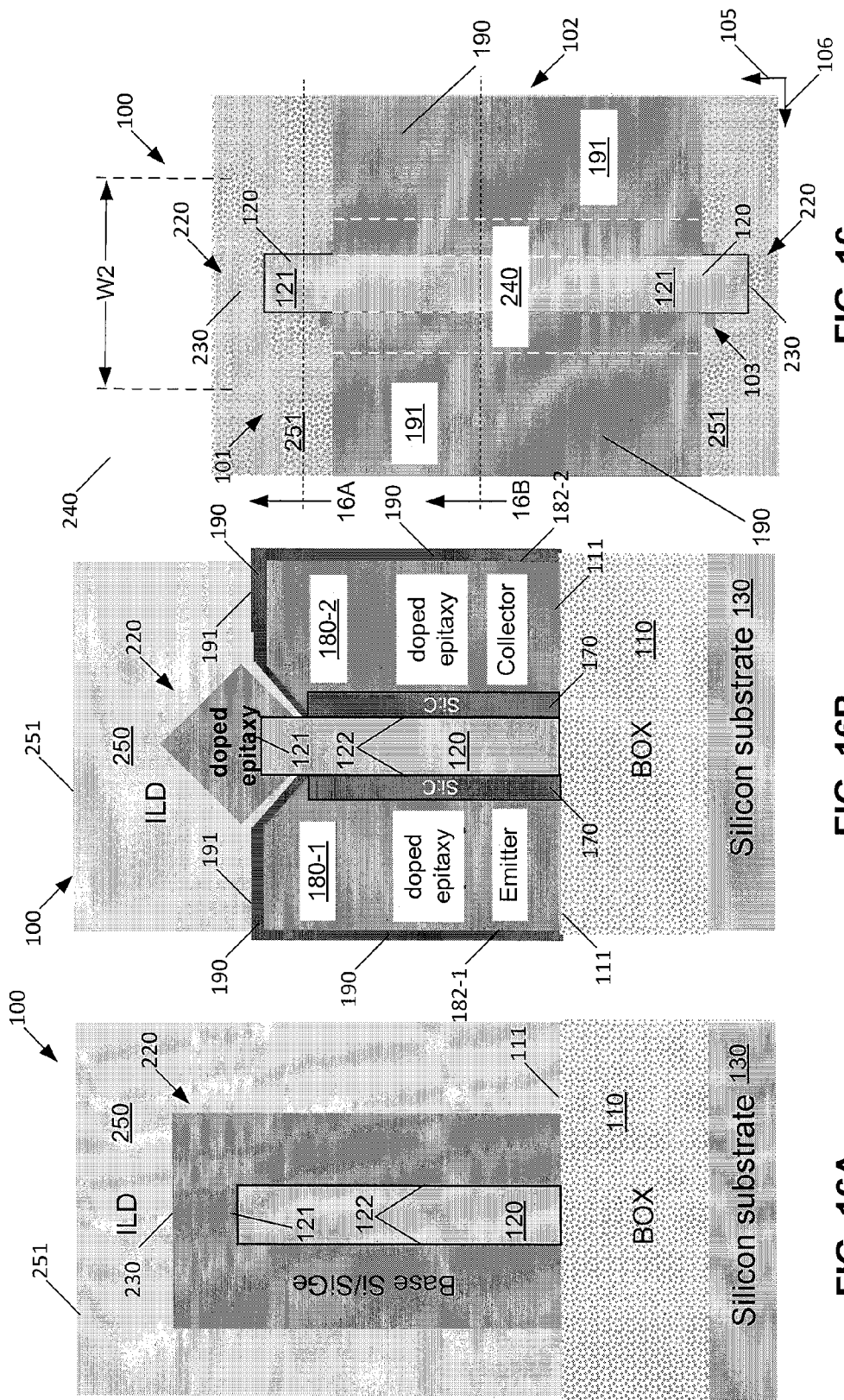

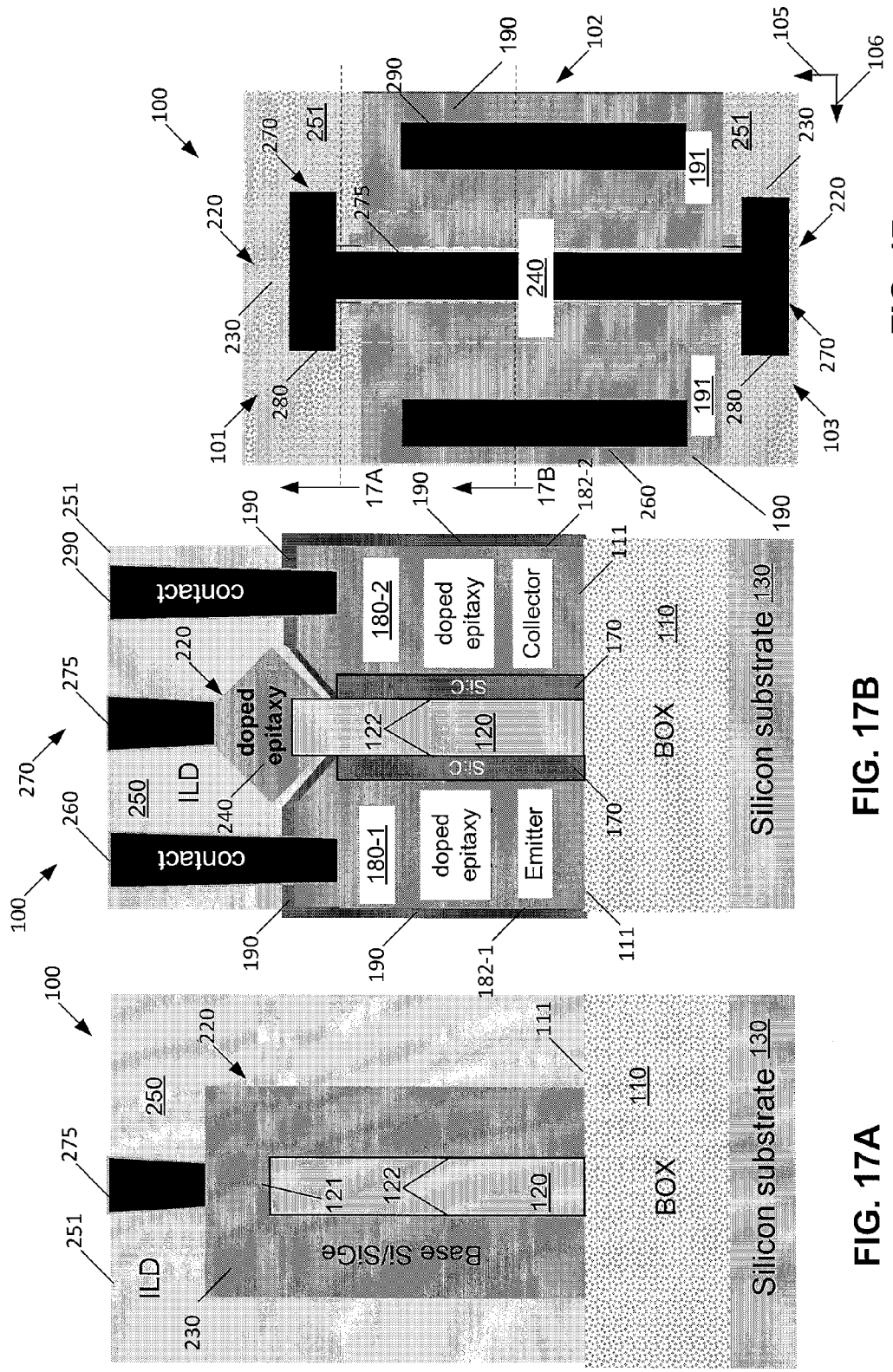

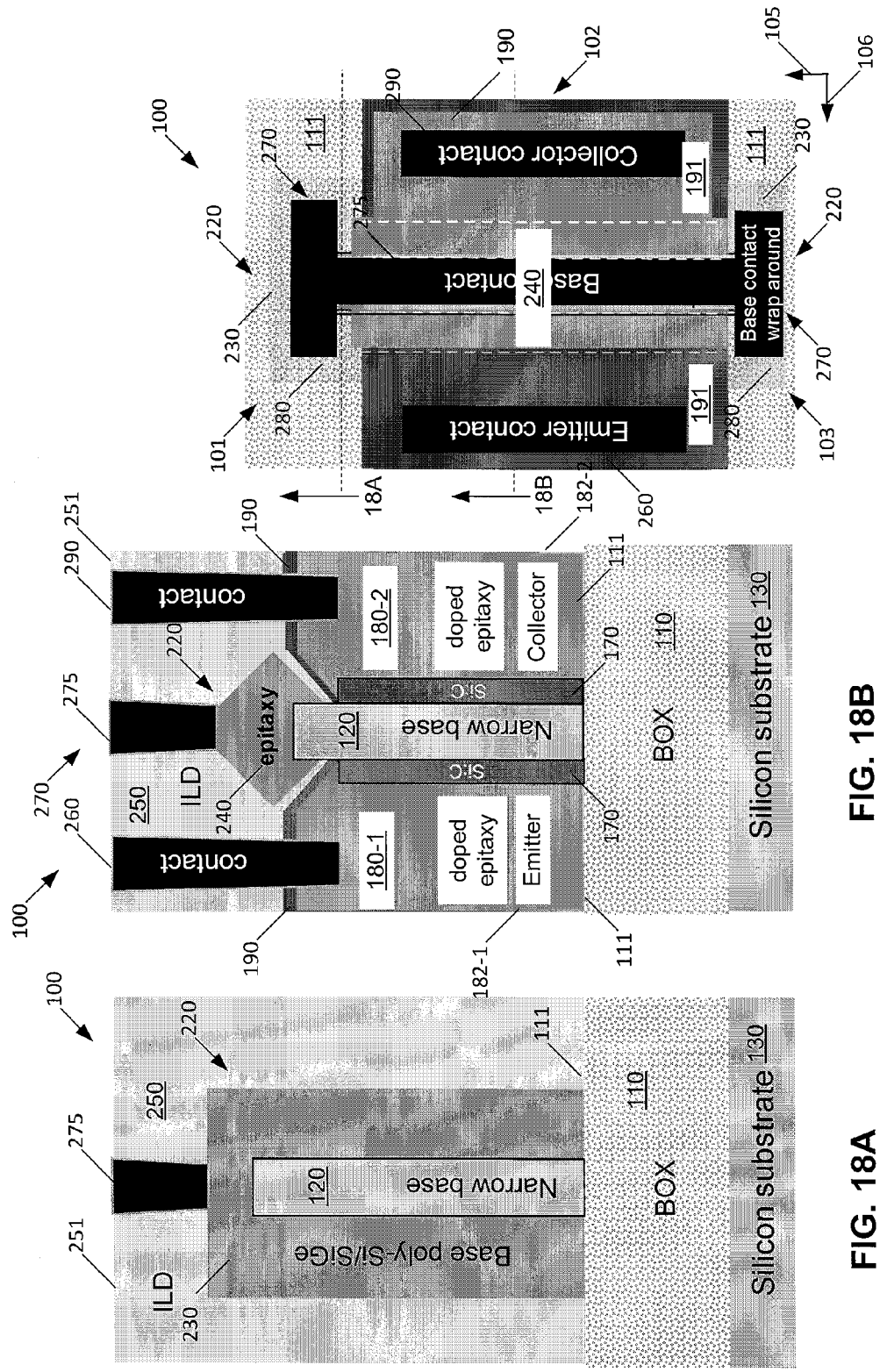

BIPOLAR JUNCTION TRANSISTORS AND METHODS FORMING SAME

BACKGROUND

This invention relates generally to semiconductors and, more specifically, relates to bipolar junction transistors.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations that may be found in the specification and/or the drawing figures are defined below, after the main part of the detailed description section.

An SOI lateral bipolar junction transistor (L-BJT) fabricated with CMOS-compatible processes has shown competitive advantages with high drive current (e.g., greater than 3 mA/mm), low stand-by power, and operation voltages scalable with base materials. The narrow base of these designs allows for high frequency, which is highly desirable.

It is nonetheless challenging to make such thin base structures, as there can be dopant diffusion from the emitter and collector into the base during fabrication, and this dopant diffusion will, e.g., broaden the emitter and collector regions that lead to shorter spacing between them and increase the possibility of electrical short.

SUMMARY

In an exemplary embodiment, a method for Ruining a bipolar junction transistor is disclosed. The method includes forming a pillar on a buried oxide layer that is itself formed on a silicon substrate. The pillar has top and bottom surfaces and sidewalls. The bottom surface contacts the buried oxide layer and opposite the top surface, wherein the pillar forms part of a base of the bipolar junction transistor. A hanging spacer is formed on the pillar, the hanging spacer formed to cover and abut the sidewalls of a top portion of the pillar and to cover a region over the top surface of the pillar, wherein a remaining part of each of the sidewalls is still exposed. The method also includes forming Si:C layers on the remaining, exposed bottom portion of each of the sidewalls of the pillar, and includes forming emitter and collector regions abutting the Si:C layers. The method further includes removing the hanging spacer and forming contacts to the base and to the emitter and collector regions.

In another exemplary embodiment, a bipolar junction transistor is disclosed that comprises a pillar formed on a buried oxide layer that is itself formed on a silicon substrate, the pillar having top and bottom surfaces and sidewalls, the bottom surface contacting the buried oxide layer and opposite the top surface, wherein the pillar forms part of a base of the bipolar junction transistor. The bipolar junction transistor also comprises Si:C layers formed on a bottom portion of each of the sidewalls of the pillar and leaving a top portion of the sidewalls of the pillar exposed and comprises a doped base contact formed to contact at least part of the exposed sidewalls in the top portion of the pillar. The bipolar junction transistor further comprises emitter and collector regions abutting the Si:C layers, and comprises contacts connected to the doped base contact and to the emitter and collector regions.

BRIEF DESCRIPTION OF THE SEVERAL VIEWS OF THE DRAWINGS

FIGS. 1-18 are top down views of a bipolar junction transistor, e.g., having a narrow base, at certain steps in a process flow to create the bipolar junction transistor in accordance with exemplary embodiments;

Figure 5C:
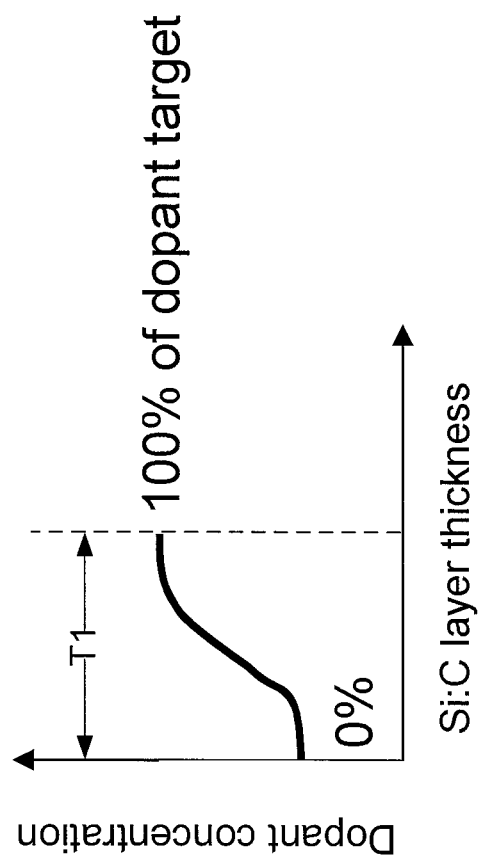

Each of FIGS. 1A-18A is a cross-sectional view of a corresponding one of the FIGS. 1-18;

Each of FIGS. 1B-18B is another cross-sectional view of a corresponding one of the FIGS. 1-18; and FIG. 5C is a graph of a dopant profile as dopant concentration in a Si:C layer (and its thickness) on sidewalls of a pillar.

DETAILED DESCRIPTION

We propose a structure and an integration flow where we grow a diffusion limiting Si:C layer onto the sidewalls of narrow base material. Epitaxially forming the emitter and collector at typical selective epitaxial growth temperatures of 600-750C will not diffuse any dopant into the narrow base, which may be 9 nm-15 nm wide. In one embodiment, the Si:C has a doping gradient of dopant used for the emitter/collector regions from no dopant to high dopant. A 2-5 nm thick (with, e.g., $5\times10^{19}$ carbon concentration doped) Si:C layer is sufficient to suppress any dopant movement from the emitter and collector during epitaxial emitter and collector formation. This structure will be thermally stable compared to conventional structures.

This BJT will work at very high frequencies, higher than reported in conventional structures. Prior Si-base (base width of 90 nm) L-BJT device shows a peak$f_T$ of 68 GHz. Modelling of structures described herein predicts a transit time of 10 psec at base width of 80 nm and <4 psec at base width of 10 nm when average collector current is >1.5 mA/µm.

An exemplary process flow to create a bipolar junction transistor, e.g., having a narrow base, in accordance with an exemplary embodiment is illustrated by the following. FIGS. 1-18 are top down views of a bipolar junction transistor 100 at certain steps in a process flow to create the bipolar junction transistor 100 in accordance with an exemplary embodiment. Each of FIGS. 1A-18A is a cross-sectional view of a corresponding one of the FIGS. 1-18. Each of FIGS. 1B-18B is another cross-sectional view of a corresponding one of the FIGS. 1-18. The cross section for FIGS. 1A-18A is at a fin end 101 of the transistor 100, see FIG. 1. The other fin end 103 does not have a cross-sectional view but the two fin ends 101, 103 are assumed to be symmetric about a center 104 of the main body location 102 (where the center 104 is also the center of the pillar along a long axis of the pillar). The cross section for FIGS. 1B-18B is at main body location 102 of the transistor 100.

Figure 1:
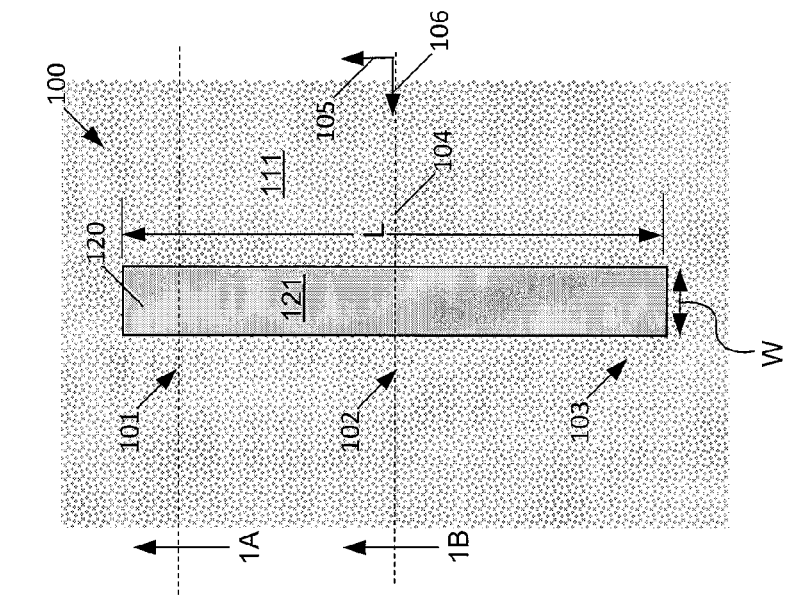
Figure 1B:
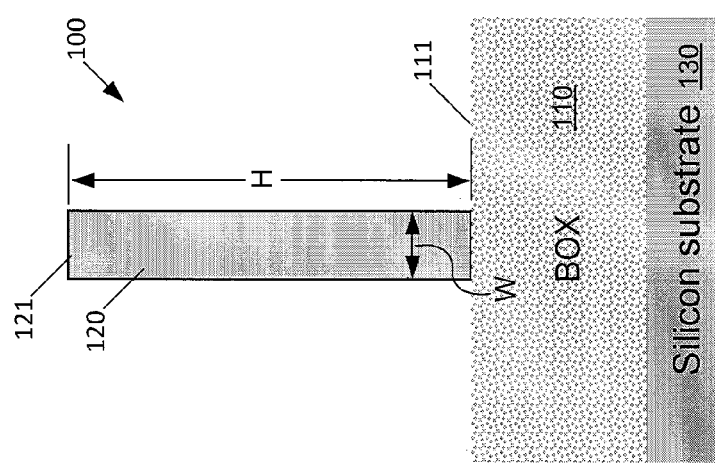
Figure 1A:
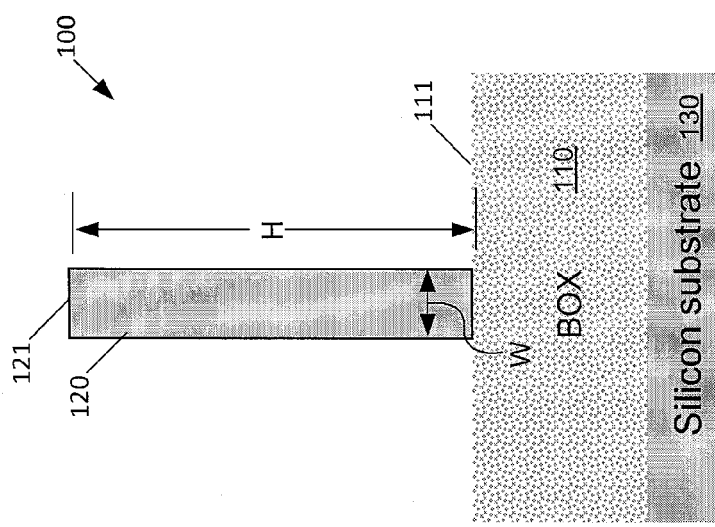

FIGS. 1, 1A, and 1B illustrate a starting point in the process flow. This starting point occurs after a layer of SOI, SGOI or III-V-on-insulator has been formed on a top surface 111 of a BOX 110 (itself formed on silicon substrate 130), and from the layer a pillar 120 (e.g., 9-15 nm wide, indicated by width W) has been formed. FIG. 1 looks down upon the top surface 121 of the pillar 120 and also the top surface 111 of the BOX 110. FIG. 1 also illustrates a "short" axis 106 and a "long" axis 106, where the short and long are used to describe relative sizes of many of the features of the bipolar junction transistor 100. For instance, the pillar has a length L along the long axis 105 that is larger than the width W along the short axis 106. The height H of the pillar 120 is also illustrated in FIGS. 1A and 1B.

Figure 2:
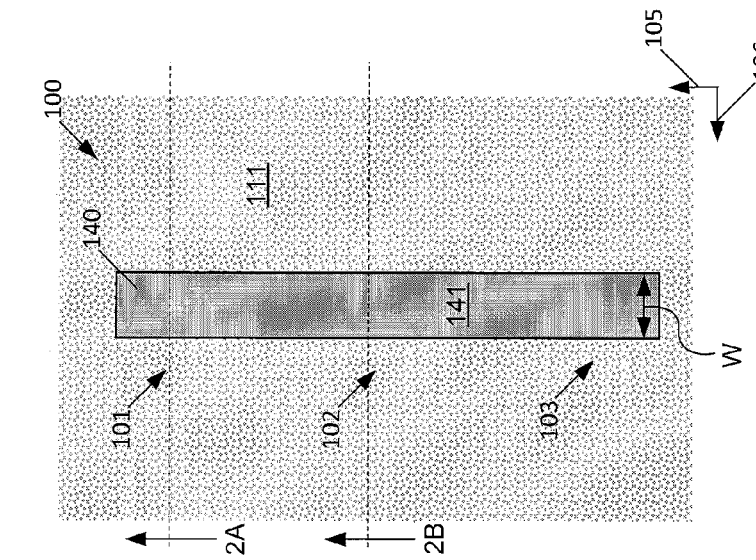
Figure 2B:
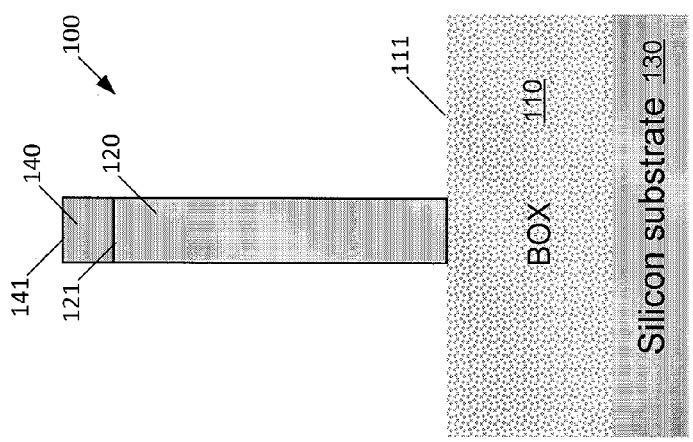
Figure 2A:
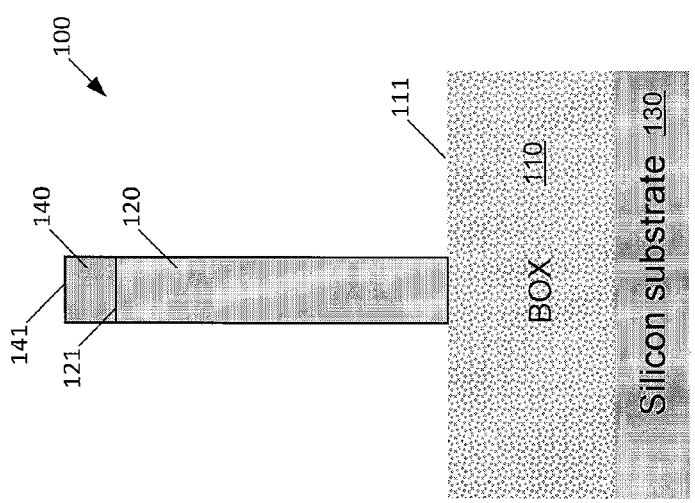

FIGS. 2, 2A, and 2B are shown at a point in the process flow after formation and removal of a hardmask 140, having a top surface 141. The hardmask 140 is removed from all but a top surface 121 of the pillar 120. The hardmask 140 protects the pillar during removal of a hanging spacer (see FIGS. 13, 13A, 13B, 14, 14A, and 14B). FIG. 2 looks down upon the top surface 141 of the hardmask 140 and also the top surface 111 of the BOX 110.

Figure 3:
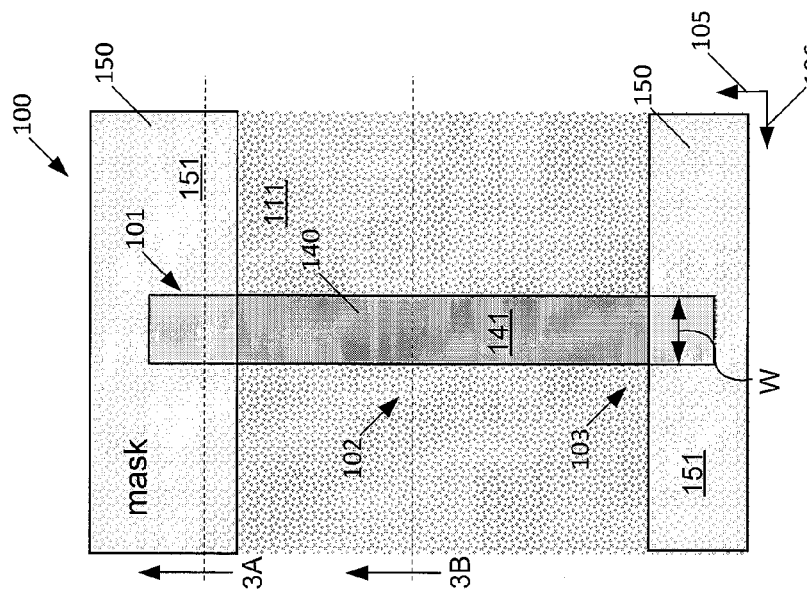
Figure 3B:
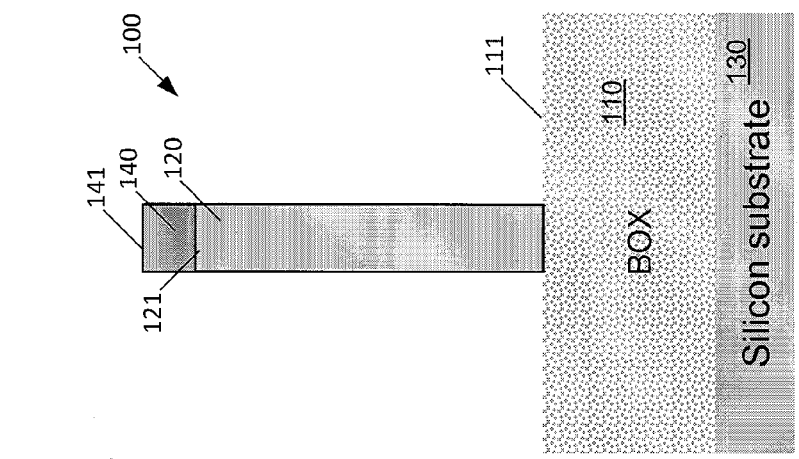
Figure 3A:
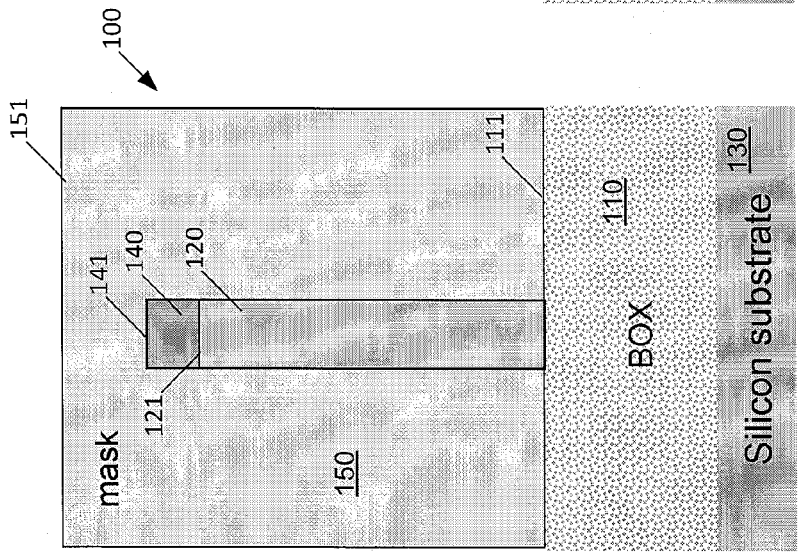

FIGS. 3, 3A, and 3B are shown at a point in the process flow after formation of a mask 150 of the fin ends 101, 103. The mask 150 is removed from the main body location 102 of the pillar 120. The top surface 151 of the mask 150 is also shown.

FIGS. 4, 4A, and 4B are shown at a point in the process flow after formation of a hanging spacer 160 over a top portion of the exposed surfaces of the pillar 120 in the main body location 102 (but the spacer 160 is not formed on the fin ends 101, 103 due to the mask 150). The hanging spacer 160 is formed overhanging some top portion 163 of the pillar 120, and ends at overhanging edges 162. The hanging spacer 160 is not formed in bottom portion 164, such that the sidewalls 122 of the pillar in this area are exposed. The hanging spacer 160 may be formed 2-10 nm thick (indicated by thickness, T). The top surface 161 of the hanging spacer 160 is also illustrated. The hanging spacer is formed by depositing a block layer (e.g., photoresist, $SiO^2$, $SiN_x$, and the like) first to the height where the hanging spacer extends. Once the hanging spacer is deposited, the block layer can be selectively removed. The purpose of the hanging spacer 160 is to allow insertion of the Si:C layers on the sidewalls of the pillar 120 before the epitaxial emitter and collector regions are formed, as illustrated below. Note also the hanging spacer is needed so that a base contact (see, e.g., FIGS. 17, 17A, and 17B) will not touch the Si:C layers 170 (see, e.g., next figures, FIGS. 5, 5A and 5B) which will short the base to the E/C regions.

FIGS. 5, 5A, and 5B are shown at a point in the process flow after epitaxial growth of a Si:C layer 170 (e.g., $5 \times 10^{19}$ to $2 \times 10^{20}$ carbon concentration, with $1.2 \times 10^{20}$ as a possible concentration) on the exposed sidewalls 122 (in bottom portion 164) to a thickness of T1, between the overhanging edges 162 and the surface 11 of the BOX 110. In one embodiment, epitaxial lateral overgrowth is followed by a trimming RIE using the hanging spacer 160 to tailor Si:C thickness T1. The outer surfaces 172 can therefore be trimmed to a desired thickness, e.g., the same thickness of the hanging spacer.

In one embodiment the Si:C layer 170 has a doping gradient from no dopant to high dopant. See FIG. 5C, which is a graph of a dopant profile as dopant concentration in a Si:C layer 170 on sidewalls 122 of the pillar 120. The dopant profile corresponds to the dopant used in the emitter/collector regions. The zero percent of dopant target is close to the sidewalls 122 (near zero Si:C layer thickness) and the 100 percent is at the outer surfaces 172 (at the final Si:C layer thickness, T).

FIGS. 6, 6A, and 6B are shown at a point in the process flow after epitaxially forming the emitter 180-1 and collector 180-2 at typical selective epitaxial growth temperatures of 600-750C. The emitter and collector regions 180 need to be doped to achieve desired current gain by suppressing the base current (inversely proportional to emitter/collector doping concentration). In an NPN BJT, the dopants for N-type (emitter and collector regions) can be phosphorous and arsenic; in a PNP BJT, the dopants for P-type can be boron. Due to the Si:C layer 170, dopants will not diffuse into the narrow base. Additionally, in an exemplary embodiment, the dopant profile within the Si:C layer follows the gradient of dopant in the Si:C layer. The narrow base in the figures is the width W of the pillar 120, as the Si:C layers 170 are barriers for dopant diffusion and do not contribute to electrical conduction (though do allow carrier flow between the emitter and collector during operation of the BJT). The upper surfaces 181-1 and 181-2 (along the shorter axis 106) of the emitter 180-1 and collector 180-2 are above the overhanging edges 162. The "facets" (also referred to as "dips") 168 in the emitter/collectors 180 that are near the outer surfaces 165 of the hanging spacer are from a preferred crystalline orientation commonly seen in epitaxial growth. It is assumed the narrow base bipolar junction transistor 100 is symmetric about a long axis 105 of the pillar 120, and therefore each of the emitter 180-1 and collector 180-2 are referred to as an emitter/collector region 180.

FIGS. 7, 7A, and 7B are shown at a point in the process flow after formation of a top spacer 190 on exposed surfaces of the emitter/collector regions 180. Layer 190 is to protect the fin structure during the ILD removal process for fin end opening as described in FIG. 11. The top spacer 190 is usually made of $SiN_x$. It is formed by $SiN_x$ deposition, followed by $SiN_x$ removal. During the $SiN_x$ removal, the $SiN_x$ deposited on mask 150 (and mask top surface 151) is etched first. The figures only show the final result.

Figures 8, 8A, 8B:
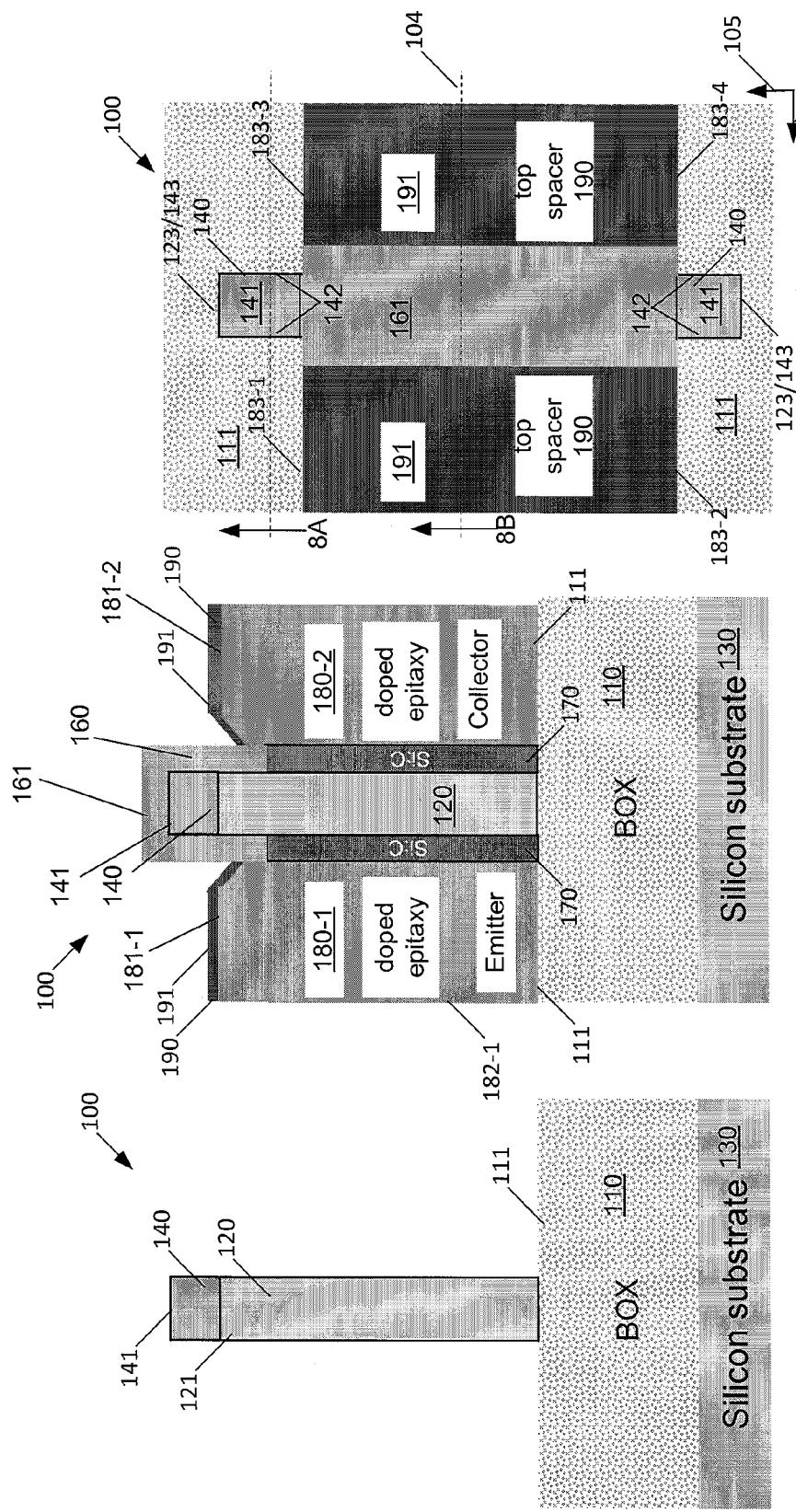

FIGS. 8, 8A, and 8B are shown at a point in the process flow after removal of mask 150. This exposes sidewalls 183 of emitter/collector regions 180, along a longer axis of the regions 180. In particular, the emitter 180-1 has sidewalls 183-1 and 183-2, and the collector 180-2 has sidewalls 183-3 and 183-4. Sidewalls 142 of the hardmask 140 and end walls 143 of the hardmask 140 (and end walls 123 of the pillar 120). The end walls 123 and 143 are at ends of the pillar 120 and hardmask 140, respectively, perpendicular to the long axis 105 (and parallel to the short axis 106) along a longer length of the pillar 120.

FIGS. 9, 9A, and 9B are shown at a point in the process flow after formation of additional spacer 190 to protect epitaxy sidewalls. It can be seen that the spacer 190 now covers many exposed surfaces, such as sidewalls 122 of pillar 120 in the fin ends 101/103, sidewalls 142 and end walls 143 of the hardmask 140 (and end walls 123 of the pillar 120) in the fin ends 101/103, sidewalls 182 of the emitter/collector regions 180 (illustrated as sidewall 182-1 of the emitter 180-1 and sidewall 182-2 of the collector 180-2), and sidewalls 183 of the emitter/collector regions 180 (illustrated as sidewalls 183-1 and 183-2 of the emitter 180-1 and sidewalls 183-3 and 183-4 of the collector 180-2).

FIGS. 10, 10A, and 10B are shown at a point in the process flow after ILD fill and CMP have been performed. The ILD layer 200 covers the exposed surfaces and has a top surface 201, formed by the CMP. In FIG. 10, the ILD layer 200 is shown as being semitransparent. This semitransparency is indicated by the top spacer 190 being seen even though the ILD layer 200 is on top of the top spacer 190 and also indicated by the hanging spacer 160 being seen even though this is under the ILD layer 200. The hardmask 140 at the fin ends 101/103 is also shown, although this is under the ILD layer 200.

Figures 11, 11A, 11B:
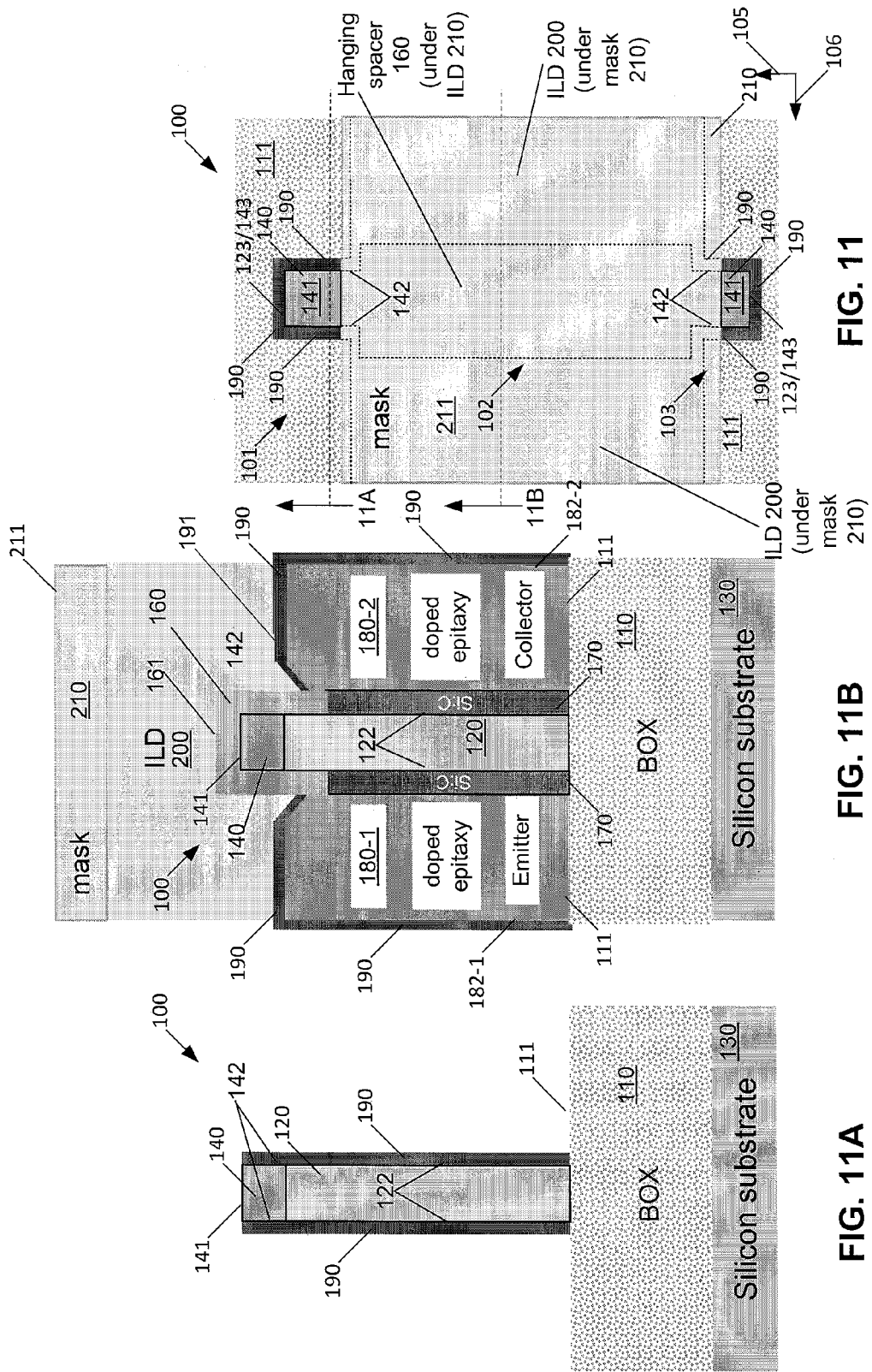

FIGS. 11, 11A, and 11B are shown at a point in the process flow after formation of a mask 210 and opening of the fin ends 101 and 103. The mask 210 protects, e.g., the ILD layer 200 around the main body location 102 during the opening of the fin ends 101/103. The top surface 211 of the mask 210 is also illustrated. It can be seen that the top surface 141 of the hardmask 140 is exposed, as is the top surface 111 of the BOX 110, at both fin ends 101, 103. The top mask 190 on the surfaces 122, 123 of the pillar 120 (and the surfaces 142, 143 of the hardmask 140) protect these surfaces during this step. Semitransparency in FIG. 11 is indicated by the ILD layer 200 being seen even though the mask 210 is on top of the ILD layer 200 and also indicated by the hanging spacer 160 being seen even though this is under the ILD layer 200 and the mask 210.

Figures 12, 12A, 12B:
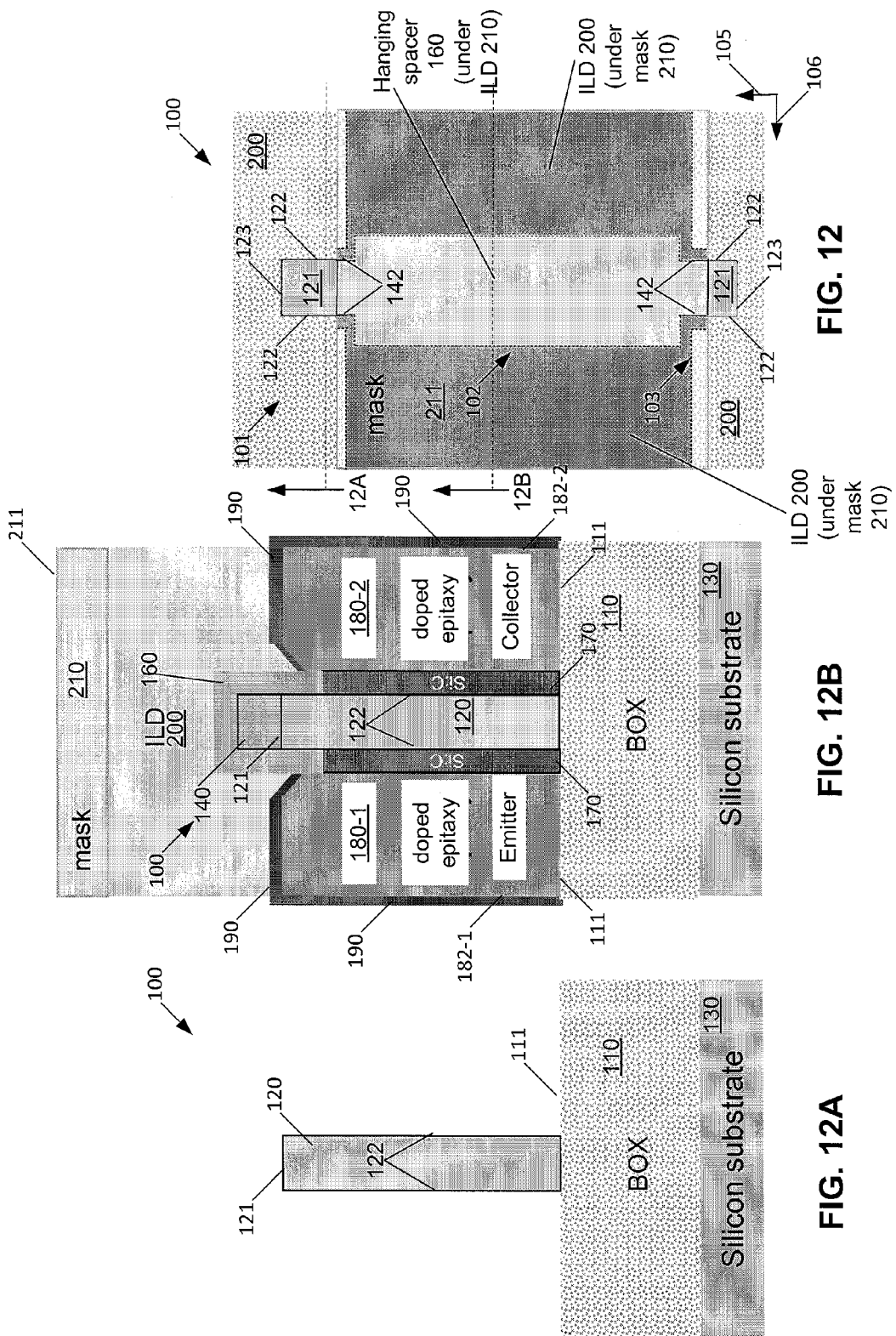

FIGS. 12, 12A, and 12B are shown at a point in the process flow after removal of the mask 140 and spacer 190 from the fin ends 101, 103. This removes the spacer 190 from the sidewalls 122 and the end walls 123 of the pillar 120. The top surface 121 of the pillar 120 is exposed at the fin ends 101, 103, as are the sidewalls 122 of the pillar 120. The hardmask 140 is removed at the fin ends 101, 103. Semitransparency in FIG. 11 is indicated by the ILD layer 200 being seen even though the mask 210 is on top of the ILD layer 200 and also indicated by the hanging spacer 160 being seen even though this is under the ILD layer 200 and the mask 210. Semitransparency in FIG. 12 is indicated by the ILD layer 200 being seen even though the mask 210 is on top of the ILD layer 200 and also indicated by the hanging spacer 160 being seen even though this is under the ILD layer 200 and the mask 210.

Figures 13, 13A, 13B:
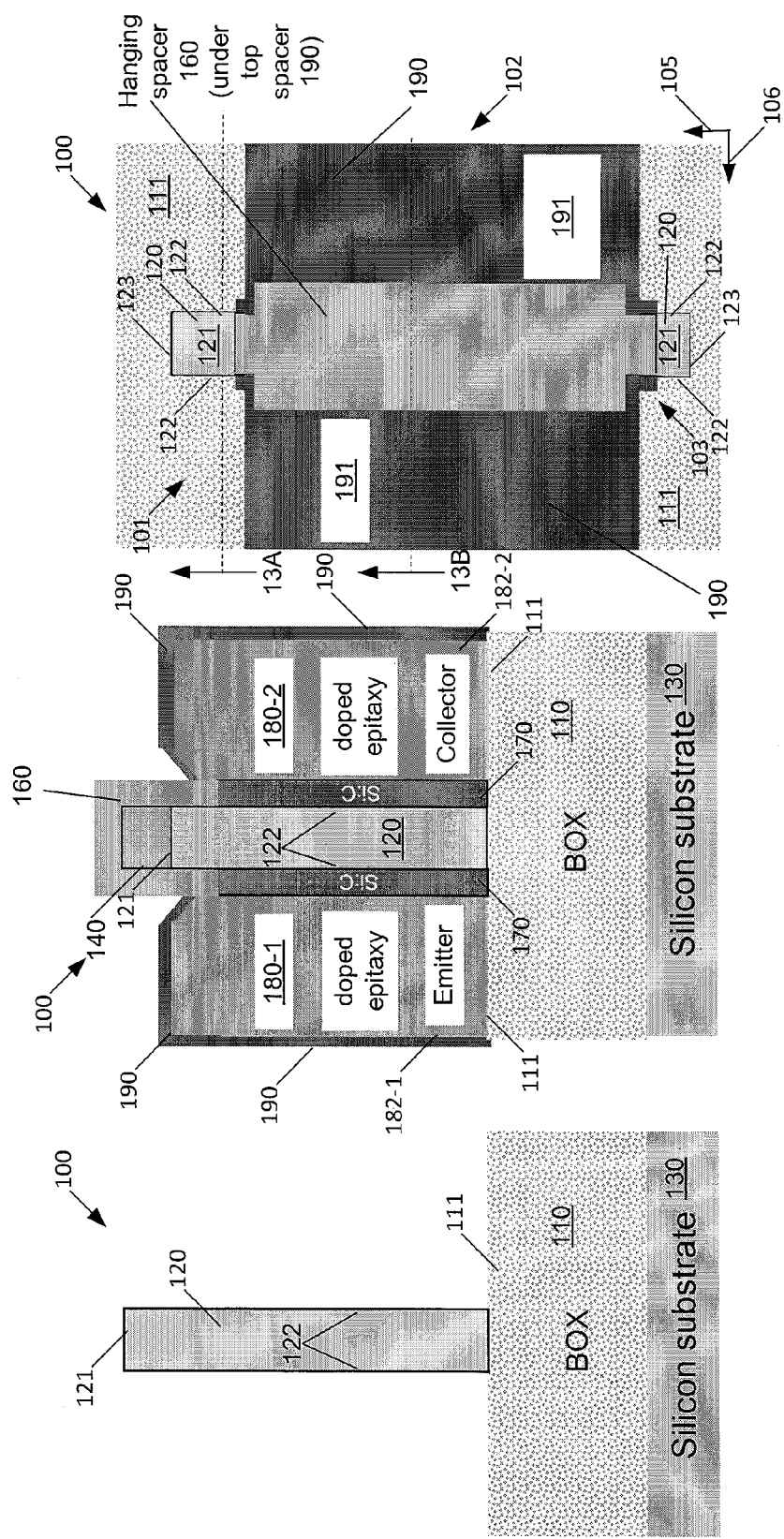

FIGS. 13, 13A, and 13B are shown at a point in the process flow after removal of the mask 210 and ILD layer 200 from the main body region 102 of the bipolar junction transistor 100. This exposes the top layer 191 of the top spacer 190 in the main body region 102.

Figures 14, 14A, 14B:
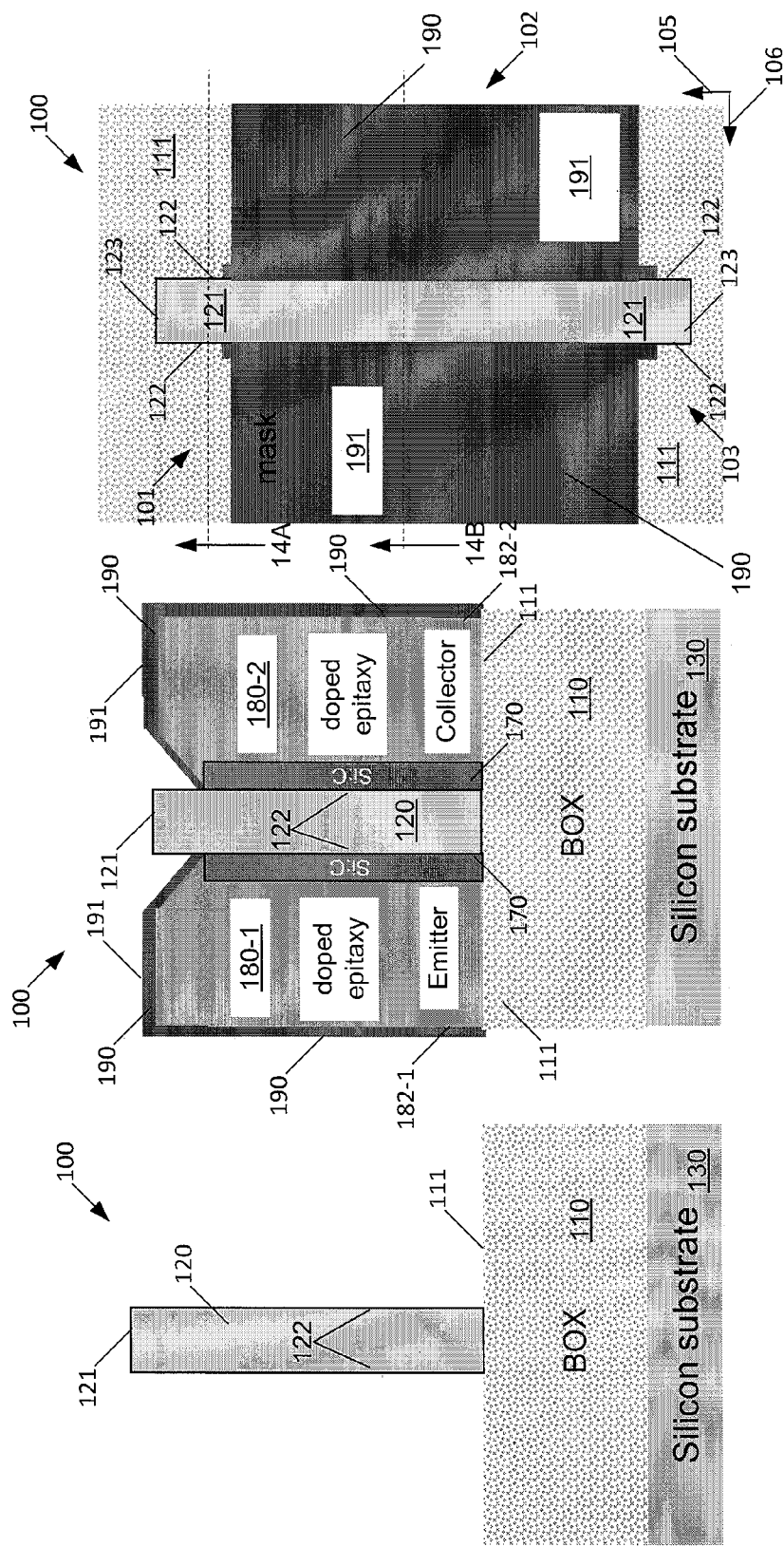

FIGS. 14, 14A, and 14B are shown at a point in the process flow after removal of the hanging spacer 160. This exposes the top surface 121 of the pillar 120. The spacer removal process can be made to be selective to the fin material, therefore the pillar 120 in the fin ends 101/103 is not affected.

FIGS. 15, 15A, and 15B are shown at a point in the process flow after a doped base contact 220 is formed using selective in-situ doped epitaxy or doped polysilicon material. The doped base contact 220 comprises a main portion 240 and fin portions 230, and both of these may be formed at a same process step in an exemplary embodiment. The faceted shape of the base contact 220 is from the preferred crystalline orientation of epitaxial growth. The base contact is formed by growth from the fin (semiconductor) material and no growth from the top spacer. However, if the epi growth is excessive, the base contact could come in contact with the top spacer. The figure just illustrates a well-controlled situation. The main portion 240 of the doped base contact 220 covers the pillar 120 in the main body location 102. The fin portions 230 of the doped base contact 220 are in the region of and overlap the fin ends 101 and 103 and have a width (W2) larger than the width (W1) of the main portion 240. The width W2 is larger than the length L1. The fin portions 230 cover and abut exposed surfaces 121, 122, and 123 of the pillar 120 in the fin ends 101/103. Semitransparency in FIG. 15 is indicated by the pillar 120 (and its top surface 121) being shown although the pillar is underneath the main portion 240 of the base contact 220.

FIGS. 16, 16A, and 16B are shown at a point in the process flow after a fill with ILD to create the ILD layer 250 and after CMP to create at least the top surface 251 of the ILD layer 250. Semitransparency in FIG. 16 is indicated by the pillar 120 (and its top surface 121) being shown although the pillar 120 is underneath the main portion 240 of the base contact 220 and also by the top spacer 190 (and its top surface 191) being shown even though the top spacer is covered by the ILD layer 250.

FIGS. 17, 17A, and 17B are shown at a point in the process flow after contacts have been formed. The formed contacts include the following: the emitter contact 260, which connects to the emitter 180-1; the collector contact 290, which connects to the collector 180-2; and the base contact 270, which includes both a main portion 275 over and contacting the main portion 240 of the doped base contact 220 and fin portions 280 over and contacting the fin portions 230 of the doped base contact 220. Each fin portion 280 is also referred to as a base contact wrap around.

FIGS. 18, 18A, and 18B show a final structure of a (e.g., narrow base) bipolar junction transistor 100. In FIG. 18, the ILD layer 250 is not shown.

Exemplary benefits and advantages of the process and the bipolar junction transistor 100 include the following.

1) The fin process is able to form a thin base with well-controlled width and wafer-scale production; by contract, an L-BJT formed with a planar CMOS process requires either extreme photo or e-beam lithography.

2) High aspect ratio of fin-like thin base with low-temperature epitaxy E/C enables high-frequency operation of the L-BJT device while maintaining sufficient current density; by contrast, an L-BJT formed with planar CMOS process is limited by trade-off between base width and E/C dopant diffusion.

If desired, the different functions and process steps discussed herein may be performed in a different order and/or concurrently with each other. Furthermore, if desired, one or more of the above-described functions and process steps may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following abbreviations that may be found in the specification and/or the drawing figures are defined as follows:

% percent
µm micrometers
BJT bipolar junction transistor
BOX buried oxide
C Celsius
CMOS complementary metal oxide semiconductor
CMP chemical-mechanical polishing (or chemical-mechanical planarization)
E/C emitter/collector
GHz gigaHertz
ILD inter-layer dielectric
L-BJT lateral bipolar junction transistor
mA/mm milliamps per millimeter
nm nanometer
psec picosecond
RIE reactive ion etching
SGOI SiGe on insulator
SOI silicon on insulator

What is claimed is:
1. A method for forming a bipolar junction transistor, comprising:
   forming a pillar on a buried oxide layer that is itself formed on a silicon substrate, the pillar having top and bottom surfaces and sidewalls, the bottom surface contacting the buried oxide layer and opposite the top surface, wherein the pillar forms part of a base of the bipolar junction transistor;

forming a hanging spacer on the pillar, the hanging spacer formed to cover and abut the sidewalls of a top portion of the pillar and to cover a region over the top surface of the pillar, wherein a remaining part of each of the sidewalls is still exposed;

forming Si:C layers on the remaining, exposed bottom portion of each of the sidewalls of the pillar;

forming emitter and collector regions abutting the Si:C layers;

removing the hanging spacer; and forming contacts to the base and to the emitter and collector regions.

2. The method of claim 1, wherein the pillar is formed from a layer of silicon on insulator, SiGe on insulator, or III-V-on-insulator.

3. The method of claim 1, wherein forming emitter and collector regions abutting the Si:C layers further comprises forming the emitter and collector regions at epitaxial growth temperatures of 600-750C.

4. The method of claim 1, where a portion of the base formed by the sidewalls of the pillar is between 9 nm and 15 nm wide.

5. The method of claim 1, wherein forming Si:C layers on the remaining part of each of the sidewalls further comprises forming the Si:C layers so that each Si:C layer has a doping gradient from no dopant at a location abutting a corresponding sidewall of the pillar to a high dopant concentration at a location on a sidewall of the Si:C layer that is opposite the sidewall of the pillar.

6. The method of claim 1, wherein forming Si:C layers on the remaining part of each of the sidewalls comprises forming 2-5 nm thick Si:C layers on the remaining part of each of the sidewalls.

7. The method of claim 1, wherein forming Si:C layers on the remaining part of each of the sidewalls comprises forming the Si:C layers with $5\times10^{19}$ to $2\times10^{20}$ atoms/cm$^3$ carbon concentration.

8. The method of claim 7, wherein forming the Si:C layers with $5\times10^{19}$ to $2\times10^{20}$ atoms/cm$^3$ carbon concentration further comprises forming the Si:C layers with $1.2\times10^{20}$ atoms/cm$^3$ carbon concentration.

9. The method of claim 1, further comprising forming a doped base contact over at least a portion of a longitudinal length of the pillar and over the top surface of the pillar, wherein the contact to the base is formed to contact the doped base contact.

10. The method of claim 9, wherein:

the longitudinal length of the pillar has a center region in which the hanging spacer is formed and has fin ends at ends of the longitudinal length;

the method further comprises masking, prior to forming the hanging spacer on the pillar, the fin ends with a mask so that the hanging spacer is not formed on the fin ends during forming of the hanging spacer and removing the mask in the fin ends to reveal the top surface and sidewalls of the pillar in the fin ends; and forming the doped base contact further comprises forming a part of the doped base contact over the revealed top surface and sidewalls of the pillar in the fin ends.

11. The method of claim 1, wherein:

a longitudinal length of the pillar has a center region in which the hanging spacer is formed and has fin ends at ends of the longitudinal length;

the method further comprises masking, prior to forming the hanging spacer on the pillar, the fin ends with a mask so that the hanging spacer is not formed on the fin ends during forming of the hanging spacer;

the method further comprises, after forming emitter and collector regions abutting the Si:C layers, forming a top spacer on exposed surfaces of the emitter and collector regions, including top surfaces and sidewalls of the emitter and collector regions;

the method further comprises removing the mask in the fin ends to reveal the top surface and sidewalls of the pillar in the fin ends.

12. The method of claim 1, further comprising, prior to forming the hanging spacer on the pillar, forming a hardmask that covers and abuts the top surface of the pillar, and wherein forming a hanging spacer on the pillar further comprises forming the hanging spacer on the pillar to cover and abut the hardmask.

13. A bipolar junction transistor, comprising:

a pillar formed on a buried oxide layer that is itself formed on a silicon substrate, the pillar having top and bottom surfaces and sidewalls, the bottom surface contacting the buried oxide layer and opposite the top surface, wherein the pillar forms part of a base of the bipolar junction transistor;

Si:C layers formed on a bottom portion of each of the sidewalls of the pillar and leaving a top portion of the sidewalls of the pillar exposed;

a doped base contact formed to contact at least part of the exposed sidewalls in the top portion of the pillar;

emitter and collector regions abutting the Si:C layers; and contacts connected to the doped base contact and to the emitter and collector regions.

14. The apparatus of claim 13, wherein the pillar is formed from a layer of silicon on insulator, SiGe on insulator, or III-V-on-insulator.

15. The apparatus of claim 13, wherein forming emitter and collector regions abutting the Si:C layers further comprises forming the emitter and collector regions at epitaxial growth temperatures of 600-750C.

16. The apparatus of claim 13, where a portion of the base formed by the sidewalls of the pillar is between 9 nm and 15 nm wide.

17. The apparatus of claim 13, wherein each Si:C layer has a doping gradient from no dopant at a location abutting a corresponding sidewall of the pillar to a high dopant concentration at a location on a sidewall of the Si:C layer that is opposite the sidewall of the pillar.

18. The apparatus of claim 13, wherein each of the Si:C layers is 2-5 nm.

19. The apparatus of claim 13, wherein the Si:C layers have $5\times10^{19}$ to $2\times10^6$ atoms/cm$^3$ carbon concentration.

20. The apparatus of claim 19, wherein the Si:C layers have $1.2\times10^{20}$ atoms/cm3 carbon concentration.

21. The apparatus of claim 13, wherein the doped base contact is formed over at least a portion of a longitudinal length of the pillar and over the top surface of the pillar, wherein the contact to the doped base contact is formed to contact the doped base contact.

22. The apparatus of claim 21, wherein:

the longitudinal length of the pillar has a center region in which the Si:C layers are formed and has fin ends at ends of the longitudinal length and in which the Si:C layers are not formed; and a portion of the doped base contact is formed over and abuts a top surface and sidewalls of the pillar in the fin ends.

23. The apparatus of claim 13, wherein:
- a longitudinal length of the pillar has a center region in which the Si:C layers are formed and has fin ends at ends of the longitudinal length and in which the Si:C layers are not formed;
- the apparatus further comprises a top spacer covering and abutting top surfaces and sidewalls of the emitter and collector regions but the top spacer does not cover a top surface and sidewalls of the pillar in the fin ends.

* * * * *